United States Patent [19]

Neilson

[11] Patent Number: 5,243,211
[45] Date of Patent: Sep. 7, 1993

[54] POWER FET WITH SHIELDED CHANNELS

[75] Inventor: John M. S. Neilson, Norristown, Pa.

[73] Assignee: Harris Corporation, Melbourne, Fla.

[21] Appl. No.: 797,054

[22] Filed: Nov. 25, 1991

[51] Int. Cl.⁵ ............... H01L 29/76; H01L 29/94; H01L 23/58
[52] U.S. Cl. ................... 257/339; 257/342; 257/409; 257/495
[58] Field of Search .......... 357/23.4, 23.8, 52, 357/53; 257/339, 342, 409, 495

[56] References Cited

U.S. PATENT DOCUMENTS

| | | | |
|---|---|---|---|
| 4,015,278 | 3/1977 | Fukuta | 357/22 |
| 4,055,884 | 11/1977 | Jambotkar | 29/571 |
| 4,072,975 | 2/1978 | Ishitani | 357/23 |
| 4,376,286 | 3/1983 | Lidow et al. | 357/23 |
| 4,399,449 | 8/1983 | Herman et al. | 357/23.4 |
| 4,593,302 | 6/1986 | Lidow et al. | 357/23.4 |
| 4,823,176 | 4/1989 | Baliga et al. | 357/23.4 |
| 4,920,388 | 4/1990 | Blanchard et al. | 357/23.4 |
| 4,965,647 | 10/1990 | Takahashi | 357/23.4 |
| 5,008,725 | 4/1991 | Lidow et al. | 357/23.4 |
| 5,034,785 | 7/1991 | Blanchard | 357/23.4 |
| 5,097,302 | 3/1992 | Fujihira et al. | 357/23.4 |
| 5,136,349 | 8/1992 | Yilmaz et al. | 357/23.4 |

FOREIGN PATENT DOCUMENTS

| | | | |
|---|---|---|---|
| 51-85381 | 7/1976 | Japan | 257/327 |
| 52-106688 | 9/1977 | Japan | 257/327 |
| 58-100460 | 6/1983 | Japan | 357/23.4 |
| 60-43862 | 3/1985 | Japan | 357/23.4 |
| 62-76671 | 4/1987 | Japan | 357/23.4 |
| 64-769 | 1/1989 | Japan | 357/23.4 |
| 2-35780 | 2/1990 | Japan | 357/23.4 |
| 2-143566 | 6/1990 | Japan | 357/23.4 |

Primary Examiner—William Mintel
Assistant Examiner—Steven Loke
Attorney, Agent, or Firm—Spensley Horn Jubas & Lubitz

[57] ABSTRACT

In a power FET composed of a substrate having upper and lower surfaces and having a semiconductor body providing a current flow path between the upper and lower surfaces and having at least one body region of a first conductivity type which extends to said upper surface; and at least one base region extending into the substrate from the upper surface, the base region being of a second conductivity type opposite to the first conductivity type, the base region being at least partially disposed in the current flow path and having at least two portions between which the at least one body region extends, and the FET further having an insulated gate disposed at the upper surface above the body region, the substrate further has a shielding region of the second conductivity type extending into the at least one body region from the upper surface, at a location below the gate electrode and enclosed by the base region portions, and spaced from the base region by parts of the body region of the first conductivity type. A second shielding region of the second conductivity type extends into the body region from the upper surface and extends along the peripheral edge of the substrate.

8 Claims, 1 Drawing Sheet

POWER FET WITH SHIELDED CHANNELS

BACKGROUND OF THE INVENTION

The present invention relates to power transistors of the vertical type, principal examples of which are metal oxide silicon field effect transistors (hereinafter MOSFETs) and insulated gate bipolar transistors (hereinafter IGBTs).

Transistors of this type having various geometries are disclosed, for example, in U.S. Pat. Nos. 4,823,176 and 5,008,725.

One of the limiting factors associated with known MOSFET and IGBT structures is the tradeoff which exists between gate oxide thickness, threshold voltage and the slope of the V-I characteristic. Specifically, in order to lower the threshold voltage the thickness of the gate oxide layer must be reduced and/or the impurity concentration in the channel region must be reduced. However, if the impurity concentration in the channel region is too low, the dependency of the drain current on drain voltage will increase, i.e. the current vs voltage characteristic will have a larger proportionality constant. This is because the depletion region will then partially extend into the channel region and thus lower its resistance. This is commonly referred to as the "short channel effect" and presents particular problems in devices with shallow junctions. Therefore, in the case of such devices, it is necessary to reduce the thickness of the gate oxide layer, and this gives rise to other problems due to the fact that it is more difficult to manufacture a thin gate oxide layer and such a thin layer gives rise to a reduced gate rupture voltage.

Another aspect of the above-noted tradeoff is that, all other factors being equal, an increase in breakdown voltage is associated with an increased on-resistance.

Another problem associated with prior art devices of this type is that their breakdown voltage is dependent on the structure present at their edges.

SUMMARY OF THE INVENTION

It is a primary object of the present invention to improve the operating characteristics of such power devices.

A more specific object of the invention is to lower the threshold voltage of such devices while maintaining a sufficiently high breakdown voltage, or to increase their breakdown voltage while maintaining a satisfactory threshold voltage level.

A further specific object of the invention is to lower the on-resistance of such devices.

Still another specific object of the invention is to improve the breakdown voltage of such a device at its edges.

Another specific object of the invention is to reduce the dependency of source-to-drain current on drain voltage of such devices.

The above and other objects are achieved, according to the present invention, in a power FET composed of a substrate having upper and lower surfaces and having a semiconductor body providing a current flow path between the upper and lower surfaces and having at least one body region of a first conductivity type which extends to said upper surface; and at least one base region extending into the substrate from the upper surface, the base region being of a second conductivity type opposite to the first conductivity type, the base region being at least partially disposed in the current flow path and having at least two portions between which the at least one body region extends, and the FET further having an insulated gate disposed at the upper surface above the body region, by providing the substrate with a shielding region of the second conductivity type extending into the at least one body region from the upper surface, at a location below the gate electrode and enclosed by the base region portions, and spaced from the base region by parts of the body region of the first conductivity type.

The objects according to the invention are further achieved by the provision, at the peripheral edge of the substrate of such a device, of a second shielding region of the second conductivity type extending into the body region from the upper surface of the substrate and extending along the peripheral edge.

PREFERRED EMBODIMENTS OF THE INVENTION

Figure 1:
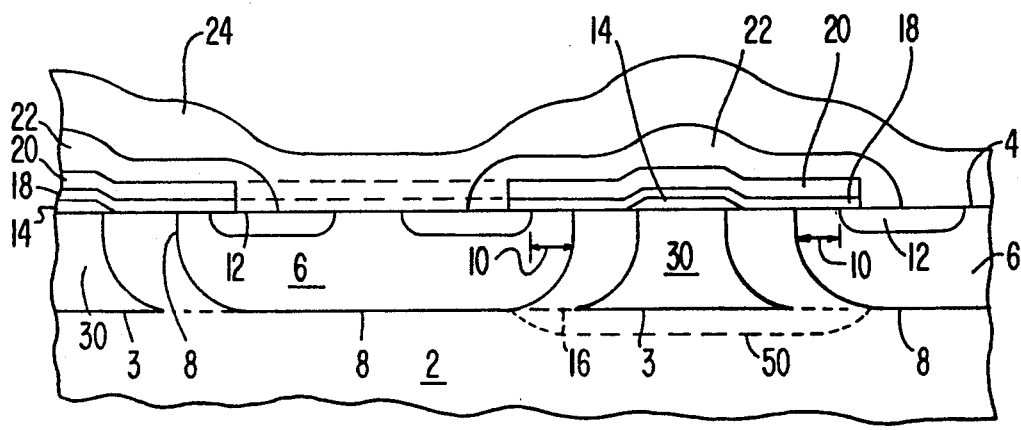
FIG. 1 is a cross-sectional view of a power FET according to a preferred embodiment of the present invention.

FIG. 1 is a cross sectional view of a portion of a MOSFET fabricated in accordance with the present invention. The type of MOSFET to which the invention is particularly directed is a power FET which is employed to produce a controlled current flow in a vertical direction between source and drain electrodes disposed at the top and bottom, respectively, of a semiconductor chip.

The MOSFET is constituted by a semiconductor substrate and the illustrated embodiment is an N channel device. It will be appreciated that the invention may be applied to P channel devices.

In the illustrated embodiment, the substrate has an $N^-$ body 2 in which is formed, at the surface 4 of the substrate, at least one P conductivity base region 6. The Fet may have a plurality of individual base regions 6 or one base region 6 having the form of a lattice.

Adjacent substrate surface 4, body 2 is given an N conductivity. A PN junction 8 is created between body 2 and region 6 and the part of region 6 adjacent both surface 4 and junction 8 constitutes the channel region 10 where switching of the MOSFET is controlled.

An $N^+$ conductivity emitter, or source, region 12 is formed in region 6 to define the end of channel region 10 which is remote from junction 8. Region 12 extends along the entire horizontal periphery of junction 8. The central part of region 6 is doped to have $P+$ conductivity.

Surface 4 is covered with an insulating layer 14, 18 of $SiO_2$, polycrystalline silicon gate regions 20 and a Boron Phosphorous Silicon Glass (BPSG) layer 22. Gate regions 20 and BPSG layer 22 are disposed above the locations where body 2 extends to surface 4. In addition, regions 20 and layer 22 extend across channels 10 and layer 22 terminates on regions 12 so that a source metal layer 24 deposited on layer 22 will contact regions 12 and the $P+$ conductivity parts of base regions 6.

According to the invention, body 2 is provided, at each location where it extends to surface 4, i.e. under each part of gate electrode 20, with a lightly doped, P− channel shielding region 30.

The structure shown in FIG. 1 may be part of a variety of insulated gate power devices. For example, if body 2, which is of N− conductivity, is disposed on an N+ region, with a drain electrode layer attached to the N+ region, the device would be an ordinary MOSFET. If, in contrast, body 2 is located above a layer structure composed of a P+ layer, or an N layer followed by a P+ layer, again with a drain electrode secured to the exterior surface of the layer structure, the device would be a COMFET, also known as an IGBT or a MOSFET with anode region.

The structure shown in FIG. 1 may be fabricated according to standard integrated circuit technology, employing the following sequence of steps:

an N− layer is grown epitaxially on the surface of a semiconductor substrate up to a surface to form the lower part of body 2;

then a P− layer is grown epitaxially on the N− layer;

then, a patterned SiO$_2$ layer 14 is produced in a conventional manner, i.e. by a sequence of steps involving deposition of a continuous SiO$_2$ layer masking, selective etching of the SiO$_2$, and removal of the mask material;

then, an N type impurity is diffused into the P− layer outside of the regions covered by patterned layer 14, in a concentration sufficient to change the conductivity of the diffused region from P− to N. The N type impurity is diffused down to at least the n− layer. The P− regions which then remain constitute shielding region, or regions, 30;

then, SiO$_2$ layer 18 and polycrystalline silicon layer 20 are deposited in sequence through openings in a single patterned mask (not shown), which mask is then removed;

using patterned layers 18 and 20 as a mask, implantation and diffusion are performed in order to create P conductivity base regions 6. This may be a double implantation and diffusion which produces a P+ region near the surface of base regions 6. Since the second diffusion will be to a substantially smaller depth than the first diffusion, the P+ region will not have any significant lateral extent under the mask provided by layers 18 and 20. The N conductivity regions remaining adjacent surface 4 after diffusion of P conductivity impurity material constitute regions of body 2;

a temporary mask (not shown) is then formed, by the selective procedure described above, at surface portions of base regions 6 spaced from layers 18 and 20, after which N conductivity material is implanted or diffused into the exposed surface regions to form N+ regions 12;

a BPSG layer is then deposited and selectively etched to create layer 22;

finally, all masking material is removed and the entire surface is covered with source metal layer 24.

It might be noted that devices could be constructed according to the present invention with the two conductivity types interchanged.

As regards the topography of a device incorporating the present invention, any topography employed for vertical power transistors could be employed. By way of example, the surface of the transistor could be of the type provided with a plurality of isolated base regions 6 with gate electrode 20 having a lattice pattern and surrounding base regions 6, as disclosed in U.S. Pat. No. 5,008,725. Such a pattern is also illustrated in FIG. 2 of the present application, which will be discussed below.

Alternatively, the structure could be composed of a plurality of spatially separated gates 20 surrounded by a network or grid connecting all of the base regions 6 together. In this case, the isolated portions of layer 18 and gate 20 could be connected together by narrow bridges of the materials constituting layers 18 and 20, as represented by broken lines in FIG. 1. As an alternative, gates 20 would be connected together by an additional layer of metallization which would increase the complexity of the overall device. A structure of this type, known in the art as an atomic lattice layout, is disclosed, for example, in U.S. Pat. No. 4,823,176.

The structure according to the present invention differs fundamentally from the known structures of this type by the provision of lightly doped regions 30 in body 2 at locations where body 2 extends to the substrate surface 4, regions 30 thus having, in the embodiment described above, a P− conductivity.

Figure 2:
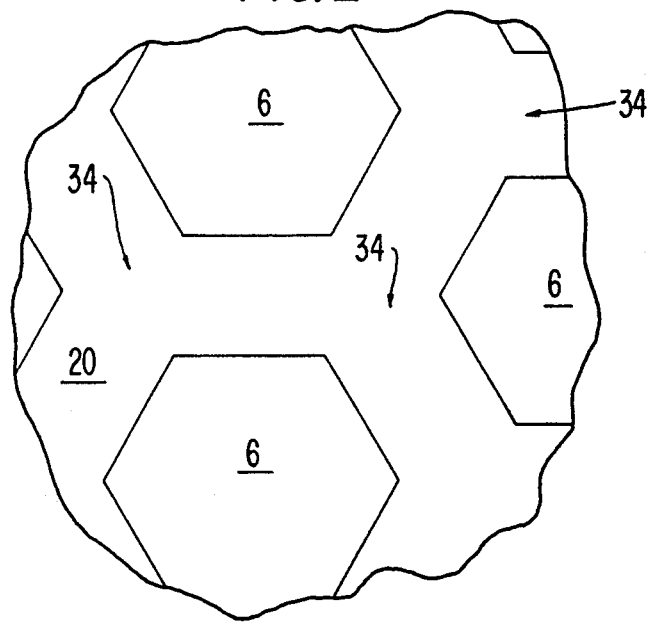
FIG. 2 is a pictorial plan view illustrating one device geometry to which the invention is particularly applicable.

Regions 30 serve to shield channel regions 10 from the drain voltage and, particularly when the device is constructed with isolated base regions 6 enclosed by a gate electrode 20 in the form of a grid as shown in FIG. 2, serve to shield the depletion region from the curvature of base regions 6 as well as from heavily doped portions at neck regions 34 of the gate grid.

By shielding the channel regions 10 from the drain voltage, the source-to drain current can be made less dependent on the drain voltage than in prior art structures.

Because of the shielding provided by the P− regions 30 in the structure according to the present invention, the channel region 10 can be more lightly doped without giving rise to the short channel effect. This, in turn, enables devices according to the invention to be made to have lower threshold voltages and thicker gate insulation layers 14, 18 than could be achieved with the prior art structures.

Another advantage offered by the present invention is the possibility of establishing a higher breakdown voltage for a given on-resistance, or, conversely, a lower on-resistance for a given breakdown voltage. This occurs because the depletion region which traverses junction 8 is shielded by regions 30 from the curvature of the edges of the base regions 6, particularly if the device has the surface geometry shown in FIG. 2. For example, MOSFETs currently made with this geometry and with a drain region resistivity of 15 ohm-cm, have a breakdown voltage of only 550 V, rather than the value of 700 V which this material could theoretically exhibit if the junctions were planar. With the structure according to the present invention, the same 550 V breakdown voltage can be achieved with a thinner body 2, and with a drain material having a lower resistivity, resulting in a significant reduction in on-resistance.

The added channel shielding region 30 according to the present invention permits further reductions in onresistance to be achieved by permitting the N conductivity regions of body 2 which are located adjacent surface 4 to be more heavily doped than has heretofore been the practice. In prior art structures, the dopant concentration in these portions of body 2 is limited by its effect on breakdown voltage. In effect, as the doping of these regions increases, the associated depletion region becomes thinner, and, as a result, the breakdown voltage decreases.

The lightly doped regions 30 according to the present invention form a guard element which allows a heavier concentration of N dopant to be provided in the regions of body 2 which extend laterally between regions 30 and base region 6. The heavier N doping at these regions is most effective to reduce on-resistance. This effect is particularly advantageous in structures where the gate electrode is in the form of a network, or mesh, as shown in FIG. 2, because in these structures, the regions 34 where three of four legs of the gate electrode structure meet are the areas which have the greatest influence on breakdown voltage and which, at the same time, contribute least to current flow.

In the device according to the present invention, the centers of these regions 34 are filled with the P$^-$ shield region 30 which enhances breakdown voltage. Thus N conductivity regions of the parts of body 2 adjacent surface 4 are concentrated adjacent the channel regions at locations which can carry current without degrading the breakdown voltage characteristic of the device.

In preferred embodiments of the invention, lightly P doped regions 30 preferably have a dopant concentration which varies between a value approximately equal to, and a value twice as great as, that originally imparted to epitaxial body 2, in terms of number of dopant ions/cm$^3$. The vertical extent of regions 30, between surface 4 and the interface between region 30 and region 2 is between 80% and 120% of the vertical extent of base region 6, between surface 4 and the interface between region 6 and region 2. If the vertical extent of regions 30 is somewhat less than that of region 6, the on-resistance of the device is improved. If the vertical extent of regions 30 is somewhat greater than that of region 6, the breakdown voltage of the device is improved. It presently appears that performance of the device will be optimized if the vertical extent of regions 30 is substantially equal to that of base region 6.

As an alternative to the fabrication procedure described earlier herein, the device shown in FIG. 1 could be produced by the following initial steps:

the substrate extends to surface 4 and initially has N$^-$ conductivity;

a P$^-$ layer is formed in the substrate by implantation or diffusion, down to level 3;

then steps described earlier, starting with production of layer 14, are performed.

Figure 3:
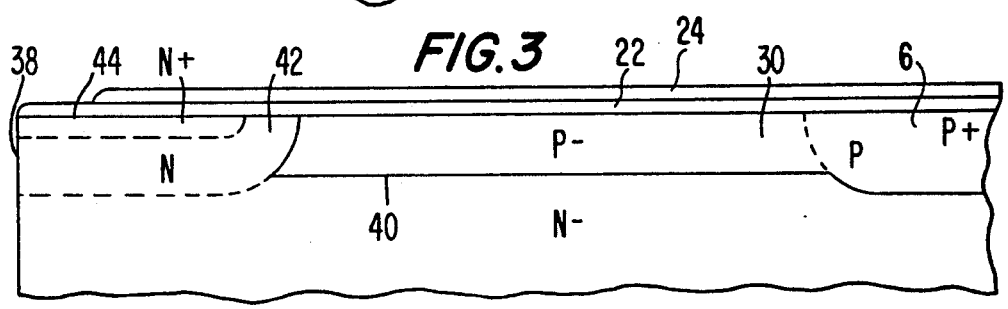
FIG. 3 is a cross-sectional view illustrating the edge region of a device according to the present invention.

In accordance with a further feature of the present invention, the edge breakdown voltage of a device can be increased by disposing, as shown in FIG. 3, a P$^-$ region 30 adjacent the device edges 38 to form a horizontal P$^-$/N$^-$ junction 40 which can support a higher voltage in less space than the currently used guard ring type of edge protection. In embodiments of the invention, the P$^-$ region 30 adjacent the edges is separated from the edges by a double diffused N conductivity structure including an N doped layer 42 and an N+ doped layer 44. The P conductivity region 6 shown to the right of region 30 is the base region portion located at the periphery of the FET. As shown, BPSG passivant 22 is provided adjacent device edge 38 and source metal layer 24 terminates at some distance from edge 38.

In the operation of a device according to the present invention, as the gate voltage is varied in a direction to block conduction, depletion regions begin to appear around junctions 8 and as the gate voltage approaches that required to effect turn off, the extent of the depletion region at each side of the junction increases. Complete turn off requires that the depletion regions extend completely across the N conductivity body regions beneath gate electrodes 20. With the construction according to the present invention, as soon as the depletion regions contact shield regions 30 the entire shield region immediately assumes the same potential as the adjacent body regions, so that a more rapid turn off occurs in response to a comparatively small gate voltage variation. When such turn off condition is created, the electric field is associated with relatively flat equipotential lines, such as shown at 50. Under these conditions, the intensity of the electric field in the substrate is reduced, allowing the device to support higher breakdown voltages.

In preferred embodiments of the invention, the vertical edges of shield regions 30 extend substantially parallel to the portions of junctions 8 which face those vertical edges, so that a constant spacing exists therebetween. In typical power FET devices, the spacing between the vertical edges of regions 30 and the facing portions of junctions 8 could be of the order of 4 microns.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed:

1. In a power FET composed of a semiconductor body having upper and lower surfaces and providing a current flow path between the upper and lower surfaces, said body having a body region of a first conductivity type which extends to said upper surface; and a plurality of base regions extending into the body from the upper surface, the base regions being of a second conductivity type opposite to the first conductivity type so that a PN junction exists between each of said base regions and said body region, the base regions being at least partially disposed in the current flow path and said body region having the form of a grid surrounding said base regions, and the FET further having an insulated gate in the form of a grid disposed at the upper surface above the body region, the improvement wherein said substrate further has a shielding region of the second conductivity type extending into said body region from said upper surface, at a location below each part of said gate electrode and enclosed by said base regions, and spaced from said base regions by parts of said body region of the first conductivity type, and wherein said shielding region has edges which extend transversely to said upper and lower surfaces and each said PN junction has a portion which faces, and has a constant spacing from, a respective transversely extending edge of said shielding region.

2. The FET as defined in claim 1 further comprising an emitter region of the first conductivity type extending into each said base region from said upper surface and spaced from said pn junction of the associated base region so that each said base region defines, between said pn junction and said emitter region and adjacent said upper surface, a channel having an effective conductivity which is varied to control current flow through said FET.

3. The FET as defined in claim 2 wherein said shielding region extends below said upper surface to a depth which is between 80% and 120% of the depth of each said base region.

4. The FET as defined in claim 3 wherein the depth to which said shielding region extends is substantially equal to the depth of each said region.

5. The FET as defined in claim 1 wherein said body comprises a first layer of the first conductivity type and an epitaxial layer of the second conductivity type grown on said first layer, said shielding region and said base regions are constituted by parts of said epitaxial layer, and said epitaxial layer is provided with a region which is located between said parts and which is doped to be of the first conductivity type and to constitute a portion of said body region.

6. The FET as defined in claim 1 wherein said substrate has a peripheral edge and a second shielding region of the second conductivity type extending into said body region from said upper surface and extending along said peripheral edge.

7. The FET as defined in claim 6 wherein said second shielding region is spaced from said peripheral edge and said substrate further has a doped edge region of the first conductivity type contacting said second shielding region and extending between said second shielding region and said peripheral edge.

8. The FET as defined in claim 7 wherein said doped edge region has a double diffused structure.

* * * * *